United States Patent
Yang et al.

(10) Patent No.: US 9,754,841 B2
(45) Date of Patent: Sep. 5, 2017

(54) METHOD OF FORMING INTEGRATED CIRCUIT HAVING PLURAL TRANSISTORS WITH WORK FUNCTION METAL GATE STRUCTURES

(71) Applicant: UNITED MICROELECTRONICS CORP., Hsin-Chu (TW)

(72) Inventors: Chih-Wei Yang, Kaohsiung (TW); Yu-Feng Liu, Tainan (TW); Jian-Cun Ke, Tainan (TW); Chia-Fu Hsu, Tainan (TW); Yu-Ru Yang, Hsinchu (TW); En-Chiuan Liou, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/060,572

(22) Filed: Mar. 3, 2016

(65) Prior Publication Data
US 2016/0190019 A1 Jun. 30, 2016

Related U.S. Application Data

(62) Division of application No. 14/520,342, filed on Oct. 22, 2014, now Pat. No. 9,318,389.

(30) Foreign Application Priority Data

Sep. 26, 2014 (CN) .......................... 2014 1 0500432

(51) Int. Cl.
*H01L 21/8238* (2006.01)
*H01L 29/423* (2006.01)
(Continued)

(52) U.S. Cl.
CPC ............... *H01L 21/823842* (2013.01); *H01L 21/28088* (2013.01); *H01L 21/28185* (2013.01); *H01L 21/82345* (2013.01); *H01L 27/088* (2013.01); *H01L 29/42372* (2013.01); *H01L 29/4966* (2013.01)

(58) Field of Classification Search
None
See application file for complete search history.

(56) References Cited

U.S. PATENT DOCUMENTS 7,732,872 B2   6/2010 Cheng
7,750,374 B2   7/2010 Capasso
(Continued)

*Primary Examiner* — Mary Wilczewski
*Assistant Examiner* — Erik T Peterson
(74) *Attorney, Agent, or Firm* — Winston Hsu

(57) ABSTRACT

The present invention provides a method of forming an integrated circuit including a substrate, a first transistor, a second transistor and a third transistor. The first transistor has a first metal gate including a first bottom barrier layer, a first work function metal layer and a first metal layer. The second transistor has a second metal gate including a second bottom barrier layer, a second work function metal layer and a second metal layer. The third transistor has a third metal gate including a third bottom barrier layer, a third work function metal layer and a third metal layer. The first transistor, the second transistor and the third transistor has the same conductive type. A nitrogen concentration of the first bottom barrier layer>a nitrogen concentration of the second bottom barrier layer>a nitrogen concentration of the third bottom barrier layer.

9 Claims, 10 Drawing Sheets

(51) Int. Cl.
*H01L 21/28* (2006.01)
*H01L 21/8234* (2006.01)
*H01L 27/088* (2006.01)
*H01L 29/49* (2006.01)

(56) References Cited

U.S. PATENT DOCUMENTS

| | | |
|---|---|---|
| 7,824,988 B2 | 11/2010 | Hoefler |
| 8,354,706 B2 | 1/2013 | Kanemura |
| 8,421,071 B2 | 4/2013 | Hatano |
| 8,604,553 B2 | 12/2013 | Shinkawata |
| 8,624,327 B2 | 1/2014 | Hung |
| 8,735,980 B2 | 5/2014 | Bulucea |
| 8,927,408 B2 | 1/2015 | Li |
| 8,987,826 B2 | 3/2015 | Kim |
| 9,064,732 B2 | 6/2015 | Yu |
| 2011/0212579 A1 | 9/2011 | Chen |
| 2011/0269276 A1* | 11/2011 | Kwon ............ H01L 21/823807 438/199 |
| 2012/0193759 A1 | 8/2012 | Takemura |
| 2013/0003441 A1 | 1/2013 | Takemura |
| 2013/0168744 A1* | 7/2013 | Hsu ................ H01L 21/823842 257/288 |
| 2013/0221441 A1* | 8/2013 | Jagannathan ... H01L 21/823842 257/350 |
| 2014/0061814 A1 | 3/2014 | Kim |
| 2014/0091402 A1 | 4/2014 | Hou |
| 2014/0097507 A1 | 4/2014 | Hsu |
| 2014/0363960 A1* | 12/2014 | Kim ................. H01L 21/82345 438/585 |
| 2015/0118835 A1 | 4/2015 | Lin |
| 2015/0145057 A1 | 5/2015 | Fan |
| 2015/0187763 A1* | 7/2015 | Kim ..................... H01L 27/088 257/392 |

* cited by examiner

METHOD OF FORMING INTEGRATED CIRCUIT HAVING PLURAL TRANSISTORS WITH WORK FUNCTION METAL GATE STRUCTURES

CROSS REFERENCE TO RELATED APPLICATIONS

This application is a Divisional of application Ser. No. 14/520,342 filed Oct. 22, 2014 and included herein by reference.

BACKGROUND OF THE INVENTION

1. Field of the Invention

The present invention is related to a method of forming an integrated circuit, and more particularly, to a method of forming an integrated circuit having a plurality of transistors with different threshold voltages.

2. Description of the Prior Art

Poly-silicon is conventionally used as a gate electrode in semiconductor devices, such as metal-oxide-semiconductors (MOS). However, with a trend toward scaling down the size of semiconductor devices, the conventional poly-silicon gate faces problems like low performances due to boron penetration, and unavoidable depletion effect that increases the equivalent thickness of the gate dielectric layer, reduces the gate capacitance, and worsens a driving force of the devices. Therefore, work function metals are used to replace the conventional poly-silicon gates as control electrodes that are suitable as high-K gate dielectric layers.

In a complementary metal-oxide semiconductor (CMOS) device, one of the dual work function metal gates is used in an NMOS device and the other one is alternatively used in a PMOS device. It is well-known that the compatibility and the process controls of the dual metal gates are more complicated, whereas the thickness and the composition controls of the materials used in the dual metal gate method are more precise. The conventional dual metal gate methods are categorized into gate first processes and gate last processes. In a conventional dual metal gate method applied with the gate first process, the annealing process for forming the source/drain ultra-shallow junction and the silicide process are performed after forming the metal gate. In the conventional gate last process, a sacrificial gate or a replacement gate is provided in a first step, followed by performing processes used to construct a normal MOS transistor. Then, the sacrificial/replacement gate is removed to form a gate trench. Consequently, the gate trench is filled with metals according to the different electrical requirements. However, because of the complicated steps of the gate last processes, the manufacturers are devoted to simplifying the manufacturing process.

In the gate first process or the gate last process, the metal gate of the PMOS or the NMOS may include a plurality of metal layers. The materials of the metal layers always affect the work function of the NMOS or the PMOS, and consequently affect the performances of the product. Thus, the manufacturers are searching for new manufacturing method to obtain a MOS with better work function performances.

SUMMARY OF THE INVENTION

The present invention therefore provides an integrated circuit having a plurality of transistors with different threshold voltages.

According one embodiment of the present invention, the present invention provides an integrated circuit including a substrate, a first transistor, a second transistor and a third transistor. The first transistor has a first metal gate including a first bottom barrier layer, a first work function metal layer and a first metal layer. The second transistor has a second metal gate including a second bottom barrier layer, a second work function metal layer and a second metal layer. The third transistor has a third metal gate including a third bottom barrier layer, a third work function metal layer and a third metal layer. The first transistor, the second transistor and the third transistor has the same conductive type. A nitrogen concentration of the first bottom barrier layer>a nitrogen concentration of the second bottom barrier layer>a nitrogen concentration of the third bottom barrier layer.

According to another embodiment of the present invention, a method of forming an integrated circuit is provided. A dielectric layer having a first trench, a second trench and a third trench are provided. Next, a bottom barrier layer is formed on the dielectric layer, wherein the bottom barrier layer comprises a first bottom barrier layer in the first trench, a second bottom barrier layer in the second trench and a third bottom barrier layer in the third trench, wherein a nitrogen concentration of the first bottom barrier layer>a nitrogen concentration of the second bottom barrier layer>a nitrogen concentration of the third bottom barrier layer. Then, a work function metal (WFM) layer is formed on the bottom barrier layer in the first trench, the second trench and the third trench. Subsequently, a metal layer is formed on the WFM layer, wherein the first trench, the second trench and the third trench are completely filled with the metal layer.

The present invention provides an integrated circuit structure having plural transistors and the method of forming the same. It is featured that the formed transistors have bottom barrier layers with different thickness and/or compositions, thereby tuning the electrical performance of the transistors and enable them different threshold voltages.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 10 are schematic diagrams of the method of forming the integrated circuit according to one embodiment of the present invention, wherein:

FIG. 1 is a schematic diagram showing the integrated circuit at the beginning of the forming process;

FIG. 2 is a schematic diagram showing the integrated circuit after performing a planarization process;

FIG. 3 is a schematic diagram showing the integrated circuit after performing an etching process;

FIG. 4 is a schematic diagram showing the integrated circuit after forming an adjust layer;

FIG. 5 is a schematic diagram showing the integrated circuit after forming an assisting layer;

FIG. 6 is a schematic diagram showing the integrated circuit after performing an annealing process;

FIG. 7 is a schematic diagram showing the integrated circuit after forming an upper bottom barrier layer;

FIG. 8 is a schematic diagram showing the integrated circuit after forming upper bottom barrier layers having different thickness;

FIG. 9 is a schematic diagram showing the integrated circuit after forming a work function metal layer; and FIG. 10 is a schematic diagram showing the integrated circuit after performing another planarization process.

DETAILED DESCRIPTION

Figure 1:
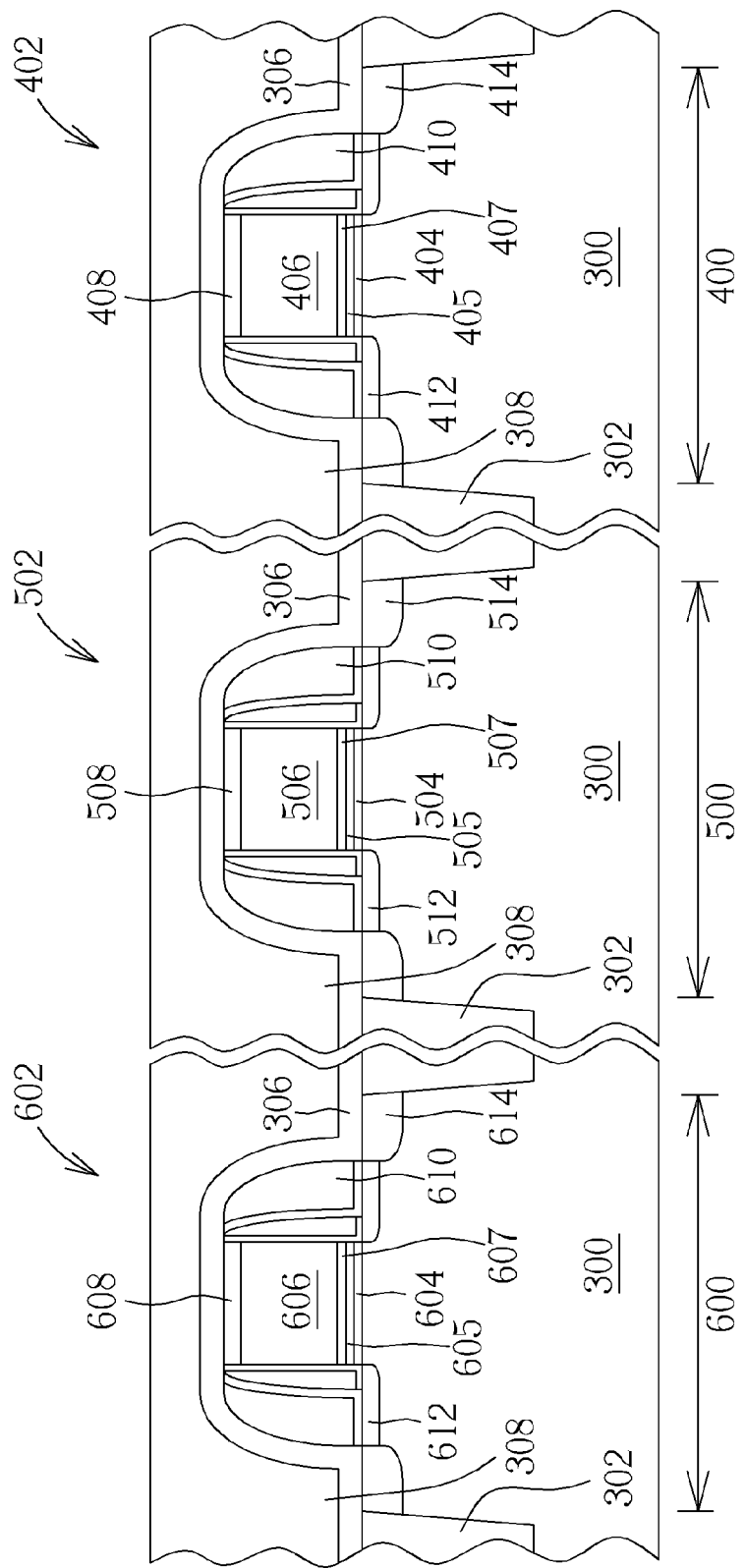

To provide a better understanding of the present invention, preferred embodiments will be described in detail. The preferred embodiments of the present invention are illustrated in the accompanying drawings with numbered elements.

Please refer to FIG. 1 to FIG. 10. FIG. 1 to FIG. 10 are schematic diagrams of the method of forming an integrated circuit according to one embodiment of the present invention. First, a substrate 300 is provided, such as a silicon substrate, a silicon-containing substrate or a silicon-on-insulator (SOI) substrate, but is not limited thereto. A plurality of shallow trench isolations (STI) 302 are disposed on the substrate 300. According to the areas encompassed by the STI 302, a first active region 400, a second active region 500 and a third active region 600, which are insulated from each other, are defined on the substrate 300. Then, a first transistor 402, a second transistor 502 and a third transistor 602 are formed on the substrate 300 in the first active region 400, the second active region 500 and the third active region 600 respectively. In one preferred embodiment of the present invention, the first transistor 402, the second transistor 502 and the third transistor 602 have the same conductive type. Preferably, they are N conductive transistors.

In one embodiment shown in FIG. 1, the first transistor 402 includes a first interface layer 404, a first high-k dielectric layer 405, a first etch stop layer 407, a first sacrificial gate 406, a first cap layer 408, a first spacer 410, a first lightly doped drain (LDD) 412 and a first source/drain 414. In one preferred embodiment of the present invention, the first interface layer 404 can be a $SiO_2$ layer. The first high-k dielectric layer 405 has a dielectric constant greater than 4, and the material thereof includes rare earth metal oxides or lanthanide oxides, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), yttrium oxide ($Yb_2O_3$), yttrium silicon oxide (YbSiO), zirconium aluminate (ZrAlO), hafnium aluminate (HfAlO), aluminum nitride (AlN), titanium oxide ($TiO_2$), zirconium oxynitride (ZrON), hafnium oxynitride (HfON), zirconium silicon oxynitride (ZrSiON), hafnium silicon oxynitride (HfSiON), strontium bismuth tantalite ($SrBi_2Ta_2O_9$, SBT), lead zirconate titanate ($PbZr_xTi_{1-x}O_3$, PZT) or barium strontium titanate ($Ba_xSr_{1-x}TiO_3$, BST), but is not limited thereto. The first etch stop layer 407 includes metal or metal/metal nitride, such as TiN. The first sacrificial gate 406 is a poly-silicon gate. In another embodiment, the first sacrificial gate 406 is a multi-layered gate including a poly-silicon layer, an amorphous silicon layer or a germanium layer. The first cap layer 408 is a SiN layer for example. The first spacer 410 can be a multi-layered structure including high temperature oxide (HTO), SiN, SiO or SiN formed by hexachlorodisilane ($Si_2Cl_6$) (HCD-SiN). The first LDD 412 and the first source/drain 414 are formed by appropriate dopants implantation. In one embodiment, the first interface layer 404 and the first etch stop layer 407 can be omitted.

The second transistor 502 includes a second interface layer 504, a second high-k dielectric layer 505, a second etch stop layer 507, a second sacrificial gate 506, a second cap layer 508, a second spacer 510, a second LDD 512 and a second source/drain 514. The components in the second transistor 502 of this embodiment are similar to those of the first transistor 402 and are therefore not described repeatedly. The third transistor 602 includes a third interface layer 604, a third high-k dielectric layer 605, a third sacrificial gate 606, a third cap layer 608, a third spacer 610, a third LDD 612 and a third source/drain 614. The components in the third transistor 602 of this embodiment are similar to those of the first transistor 402 and are therefore not described repeatedly. It is noted that since the first transistor 402, the second transistor 502 and the third transistor 602 have different threshold voltages, some components of these transistors may be different. For instance, the first source/drain 414, the second source/drain 514 and the third source/drain 614 have the same conductive type dopant, however, the concentrations thereof can be different. In another embodiment, the first high-k dielectric layer 405, the second high-k dielectric layer 505 and the third high-k dielectric layer 606 may have different thickness. In addition, the first transistor 402, the second transistor 502 and the third transistor 602 can further include other semiconductor structures that are not explicitly shown in FIG. 1, such as a silicide layer, a source/drain having an hexagon (also called sigma Σ) or an octagon shaped cross-section which is formed by selective epitaxial growth (SEG), or other protective films.

After forming the first transistor 402, the second transistor 502 and the third transistor 602, a contact etch stop layer (CESL) 306 and an inter-layer dielectric (ILD) layer 308 are formed on the substrate 300 to cover the first transistor 402, the second transistor 502 and the third transistor 602. In one embodiment, the CESL 306 can generate different degrees of stress in the first active region 400, the second active region 500 and the third active region 600 to form a selective strain scheme (SSS) for the first transistor 402, the second transistor 502 and the third transistor 602, respectively.

Figure 2:
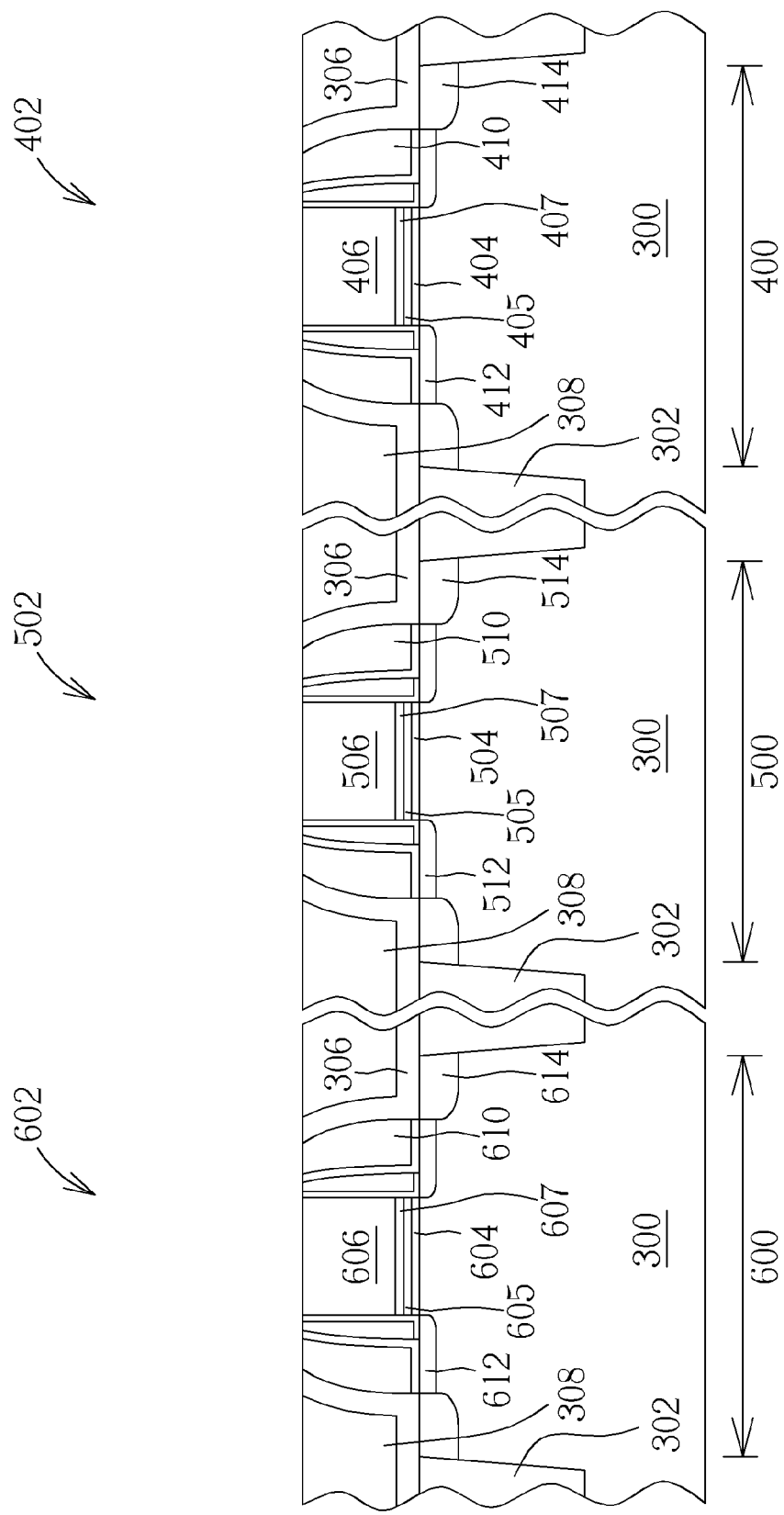

As shown in FIG. 2, a planarization process, such as a chemical mechanical polish (CMP) process or an etching-back process or combination thereof is performed to remove a part of the ILD layer 308, a part of the CESL 306, a part of the first spacer 410, a part of the second spacer 510, apart of the third spacer 610 and completely remove the first cap layer 408, the second cap layer 508 and the third cap layer 608, until the top surfaces of the first sacrificial gate 406, the second sacrificial gate 506 and the third sacrificial gate 606 are exposed.

Figure 3:
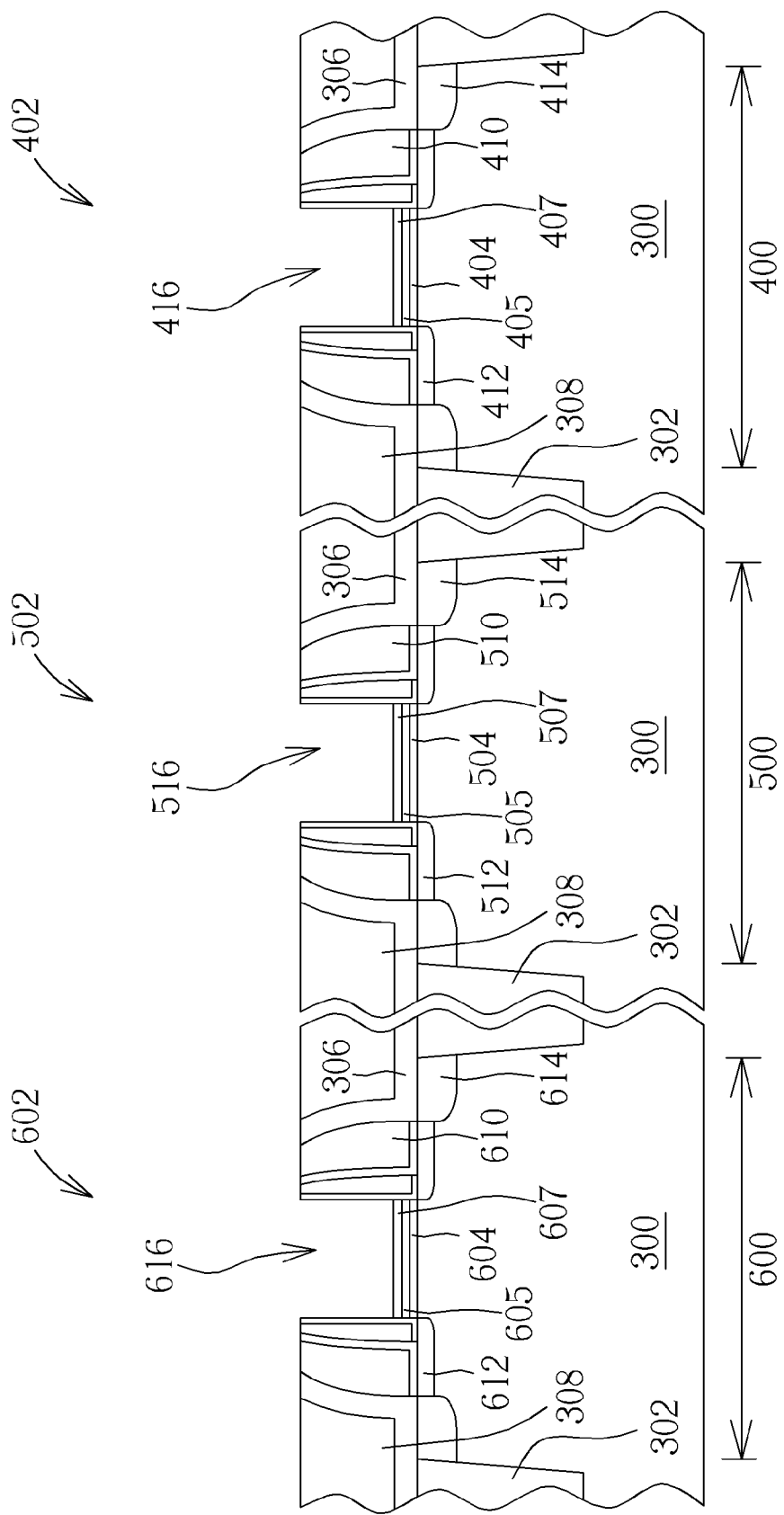

As shown in FIG. 3, a wet etching process and/or a dry etching process is performed to remove the first sacrificial gate 406, the second sacrificial gate 506 and the third sacrificial gate 606 until exposing the first etch stop layer 407, the second etch stop layer 507 and the third etch stop layer 607. A first trench 416 is formed in the first transistor 402, a second trench 516 is formed in the second transistor 502 and a third trench 616 is formed in the third transistor 602. In one embodiment, after forming the first trench 416, the second trench 516 and the third trench 616, the first etch stop layer 407, the second etch stop layer 507 and the third etch stop layer 607 can be removed.

Figure 4:
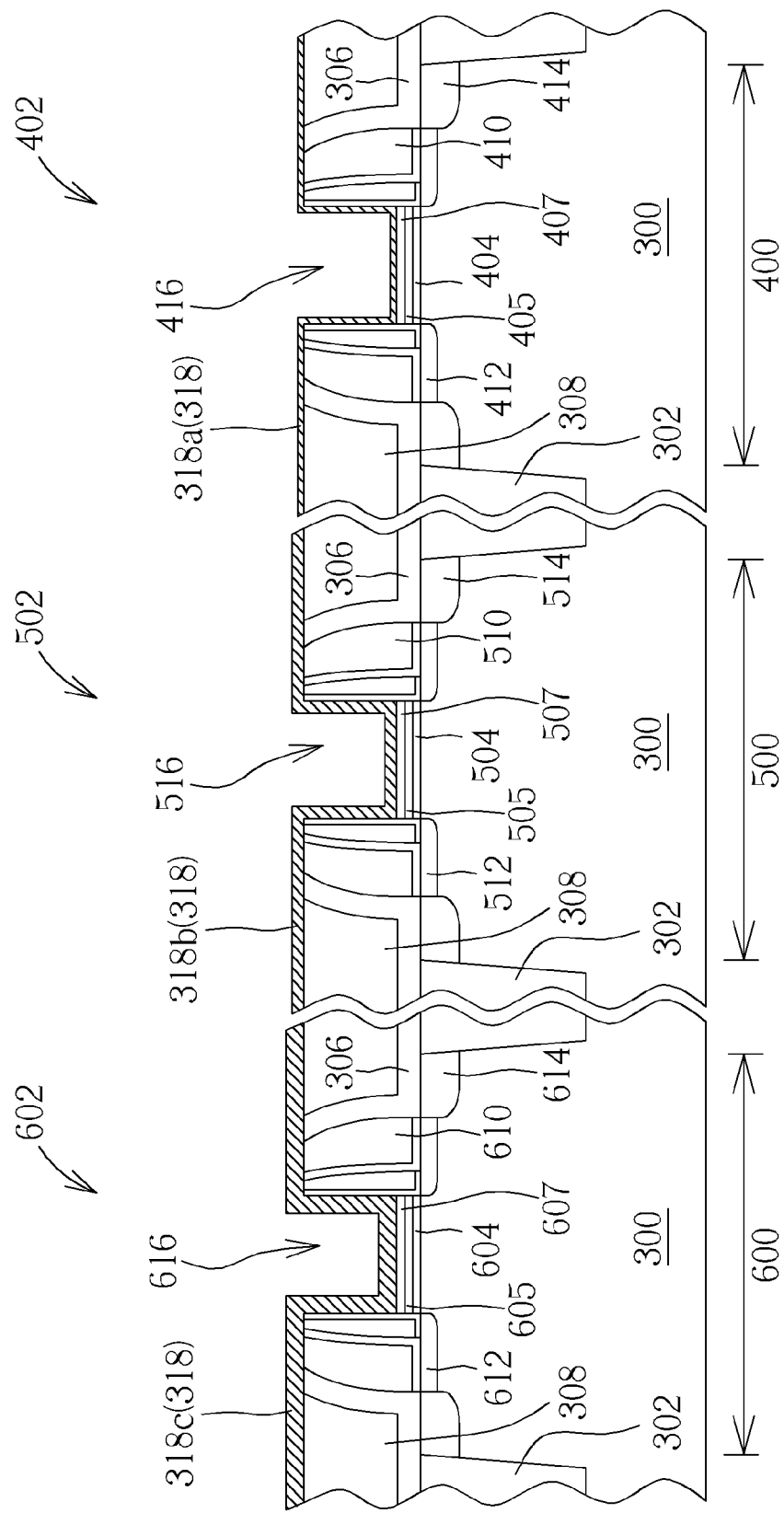

As shown in FIG. 4, an adjust layer 318 is formed comprehensively on the substrate 300 and is formed conformally along the surface of the first trench 416, the second trench 516 and the third trench 616. In one embodiment of the invention, the adjust layer 318 will become a part of the bottom barrier metal (BBM) layer in the subsequent steps and the material thereof is metal. In one embodiment, when the first transistor 416, the second transistor 516, and the third transistor 616 are N type transistors, the adjust layer 318 is, for example, titanium (Ti). As shown in FIG. 4, it is characterized in the present embodiment that the adjust layer 318 has a first adjust layer 318a in the first trench 416, which has a thinnest thickness, a second adjust layer 318b in the second trench 516, which has a middle thickness, and a third adjust layer 318c, which has a thickest thickness. In one preferred embodiment, the thickness of the first adjust layer 318 can be approximately zero.

The method for forming the adjust layer 318 with different thicknesses, for example, starts by forming an initial adjust layer (not shown) with uniform thickness in the first trench 416, the second trench 516 and the third trench 616. Next, a mask (not shown) is formed to cover the third trench 616, and an etching back process is carried out to remove a part of the initial adjust layer (not shown) in the second trench 516 and the third trench 616. Subsequently, another mask (not shown) is formed to further cover the second trench 516, followed by another etching process to further remove a part of the initial adjust layer (not shown) in the first trench 416. In one embodiment, the initial adjust layer (not shown) in the first trench 416 can be completely removed. In anther embodiment, the initial adjust layer (not shown) in the first trench 416 still remains a predetermined thickness. Lastly, all the masks are removed away. The adjust layer 318 having the first adjust layer 318a, the second adjust layer 318b and the third adjust layer 318c with different thicknesses respectively in the first trench 416, the second trench 516 and the third trench 616 can be formed.

In another embodiment, the method for forming the adjust layer 318 with different thicknesses can include forming an initial adjust layer (not shown) with uniform thickness in the first trench 416, the second trench 516 and the third trench 616. Next, a mask (not shown) is formed to cover the first trench 416 and a deposition process is performed to thicken the initial adjust layer (not shown) in the second trench 516 and the third trench 616 not covered by the mask. Another mask (not shown) is formed to further cover the second trench 516, and another deposition process is performed to thicken the initial adjust layer (not shown) in the third trench 616. A planarization process and/or an etching process is performed to remove the mask layer and the above initial adjust layer, thereby forming the adjust layer 318 with different thicknesses. In another embodiment, when the first adjust layer 318a has a zero of thickness, the method can start by directly forming a mask covering the first trench 416, and a deposition process is performed to form the initial adjust layer (not shown) in the second trench 516 and the third trench 616. Next, another mask (not shown) is formed for further covering the second trench 516, and a deposition to thicken the initial adjust layer in the third trench 616 is carried out. It is worth noting that the adjust layer 318 can also be formed by other methods and should not be limited to the above methods.

Figure 5:
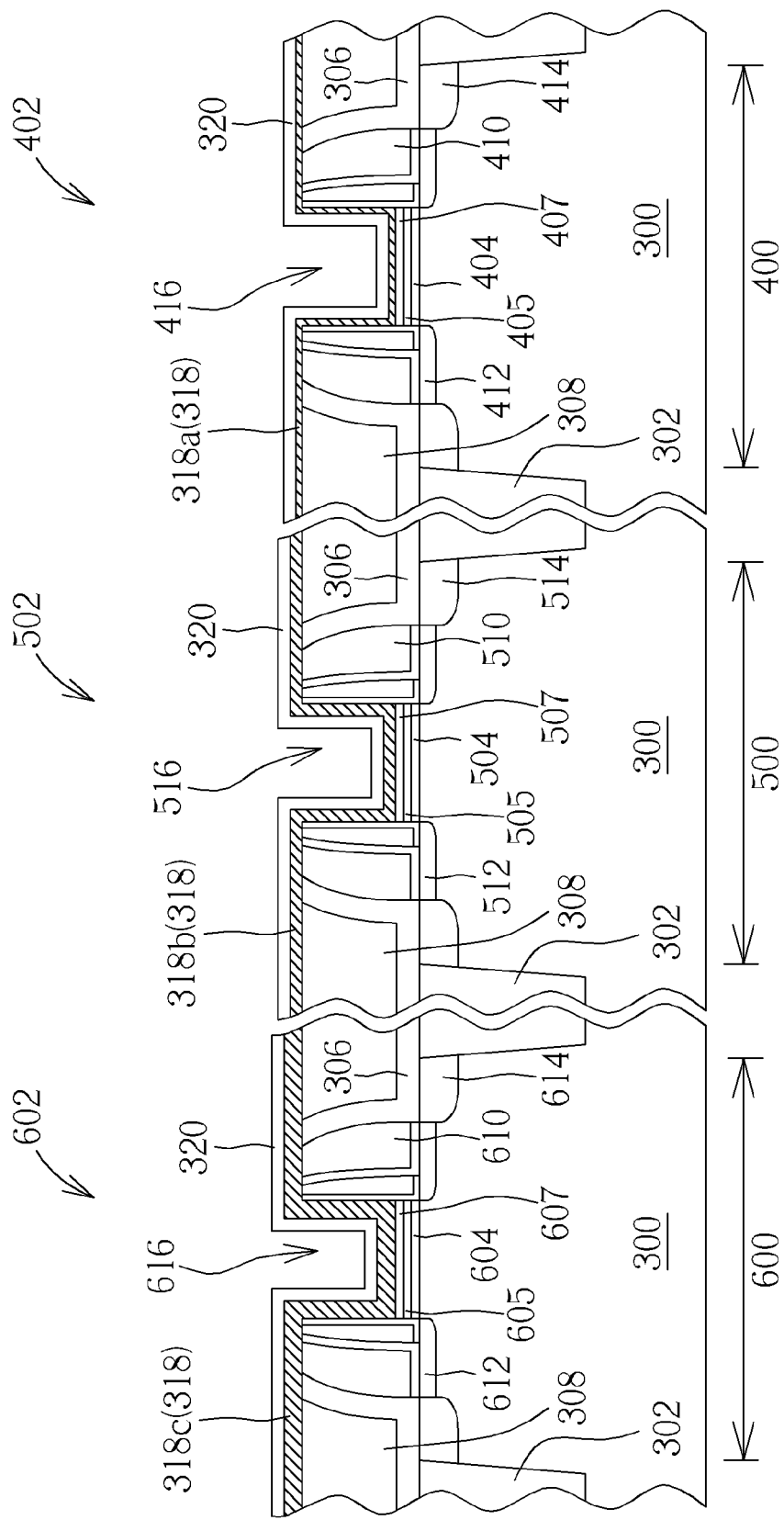

As shown in FIG. 5, an assisting layer 320 with uniform thickness is formed on the substrate 300, covering the adjust layer 318 in the first trench 416, the second trench 516 and the third trench 616. In one embodiment, the assisting layer 320 includes metal, preferably a nitride material of the adjust layer 318. For instance, when the adjust layer 318 is Ti, the assisting layer 320 can be TiN. The following context shows the embodiment of the adjust layer 318 containing Ti and the assisting layer 320 containing TiN.

Figure 6:
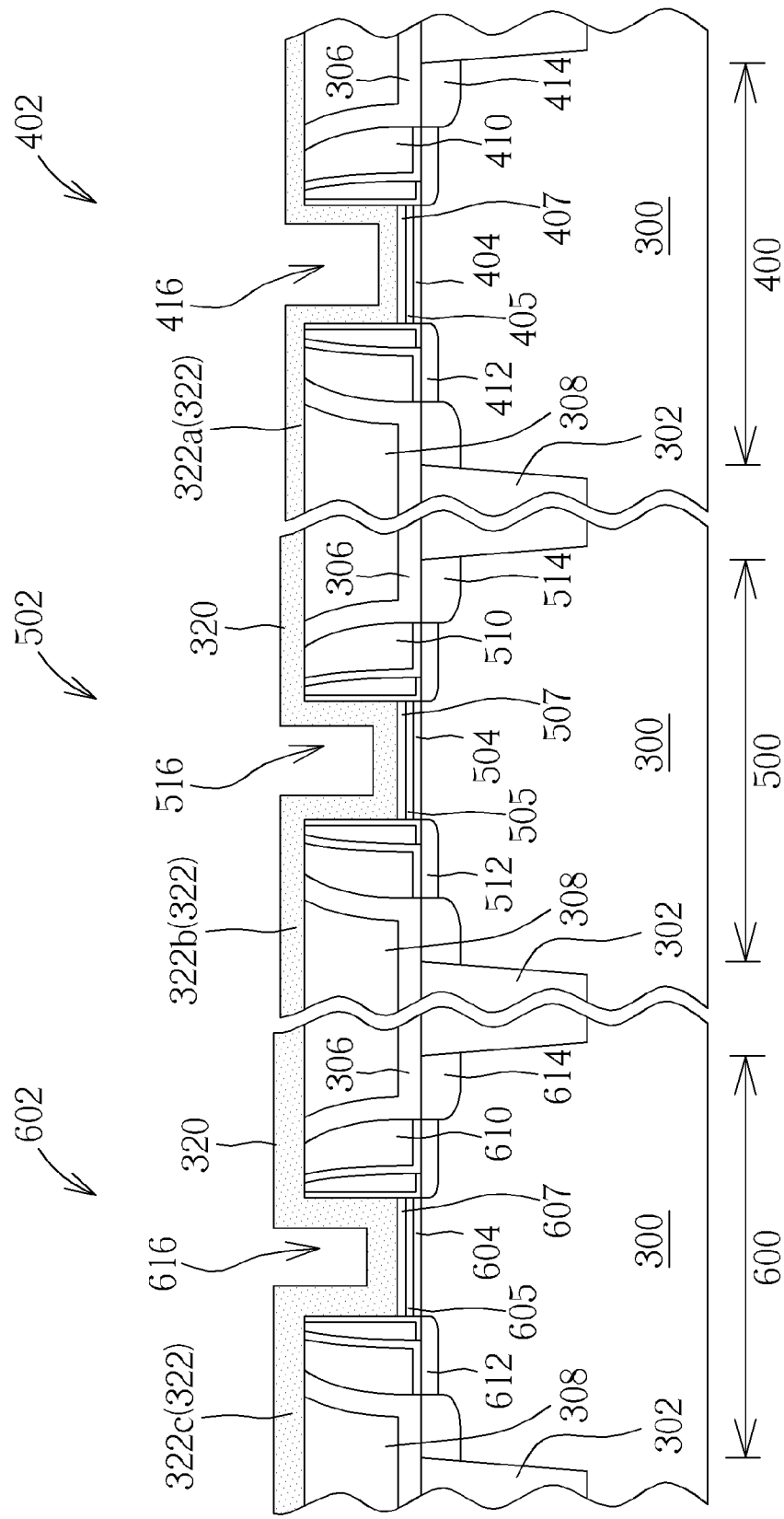

As shown in FIG. 6, an annealing process is performed to inter-diffuse the adjust layer 318 and the assisting layer 320 to form a bottom barrier layer 322. The bottom barrier layer 322 has a first bottom barrier layer 322a, a second bottom barrier layer 322b and a third bottom barrier layer 322c. The first bottom barrier layer 322a disposed in the first trench 416 is formed by "the thinnest first adjust layer 318a" and "uniform assisting layer 320". The second bottom barrier layer 322b disposed in the second trench 516 is formed by "the middle second adjust layer 318b" and "uniform assisting layer 320". The third bottom barrier layer 322c disposed in the third trench 616 is formed by "the thickest third adjust layer 318c" and "uniform assisting layer 320".

It is understood that the first bottom barrier layer 322a, the second bottom barrier layer 322b and the third bottom barrier layer 322c have different properties. In the view of thickness, the first bottom barrier layer 322a is thinnest, the second bottom barrier layer 322b is middle and the third barrier layer 322c is thickest. In one embodiment, when the thickness of the first adjust layer 318a is approximately zero, the final thickness of the first bottom barrier layer 322a is equal to that of the assisting layer 320. In the view of the material compositions, a concentration of the material of the adjust layer 320 (Ti) is smallest with respect to the first bottom barrier layer 322a, the ratio is middle in the second bottom barrier layer 322b and the ratio is largest in the third bottom barrier layer 322c. On the contrary, a concentration of the material of the assisting layer 322 (TiN) is largest with respect to the first bottom barrier layer 322a, the ratio is middle in the second bottom barrier layer 322b and the ratio is smallest in the third bottom barrier layer 322c. In other words, a nitrogen concentration in the first bottom barrier layer 322a>a nitrogen concentration in the second bottom barrier layer 322b>a nitrogen concentration in the third bottom barrier layer 322c; a titanium concentration in the first bottom barrier layer 322a<a titanium concentration in the second bottom barrier layer 322b<a titanium concentration in the third bottom barrier layer 322c. The first bottom barrier layer 322a is therefore "N rich", and the third bottom barrier layer 322c is "Ti rich." As such, the first transistor 402, the second transistor 502 and the third transistor 602 can have different electrical performance.

The above embodiment shows forming the adjust layer 318 and then forming the assisting layer 320, so the formed bottom barrier layer 322 has a Ti concentration increasing from bottom to top (from a side of the substrate 300 to the opposite side) and a N concentration decreasing from bottom to top. In another embodiment, when first forming the uniform assisting layer 320 and then forming the adjust layer 318 with different thickness, the bottom barrier layer 322 has a Ti concentration decreasing from bottom to top and a N concentration increasing from bottom to top. In another embodiment, the adjust layer 318 can have uniform thickness while the assisting layer 320 can have different thickness. For example, the assisting layer 320 has a thickest portion in the first trench 416, a middle portion in the second trench 516 and a thinnest portion in the third trench 616. In another embodiment, one or more than one nitrogen treatment can be incorporated into the above steps, thereby forming the bottom barrier layer 322 with different nitrogen concentrations.

Figure 7:
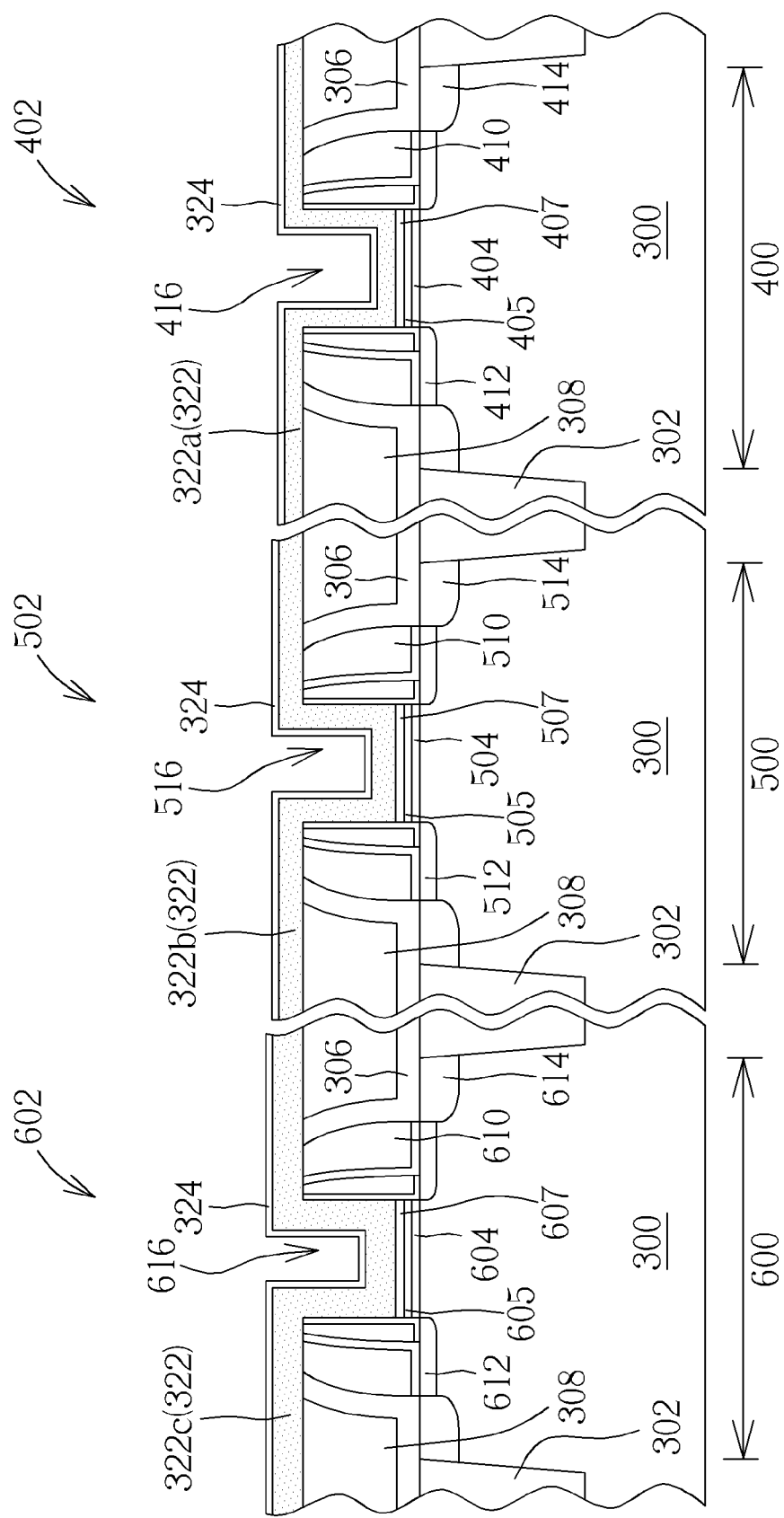

As shown in FIG. 7, an upper bottom barrier layer 324 is formed comprehensively on the substrate 300. In one embodiment, the upper bottom barrier layer 324 is formed along the surface of the first bottom barrier layer 322a in the first trench 416, the second bottom barrier layer 322b in the second trench 516 and the third bottom barrier layer 322c in the third trench 616, but these trenches 416, 516, 616 are not completely filled with the upper bottom barrier layer 324. The upper bottom barrier 324 can include TaN or Ta/TaN. In one embodiment, it is a uniform layer.

Figure 8:
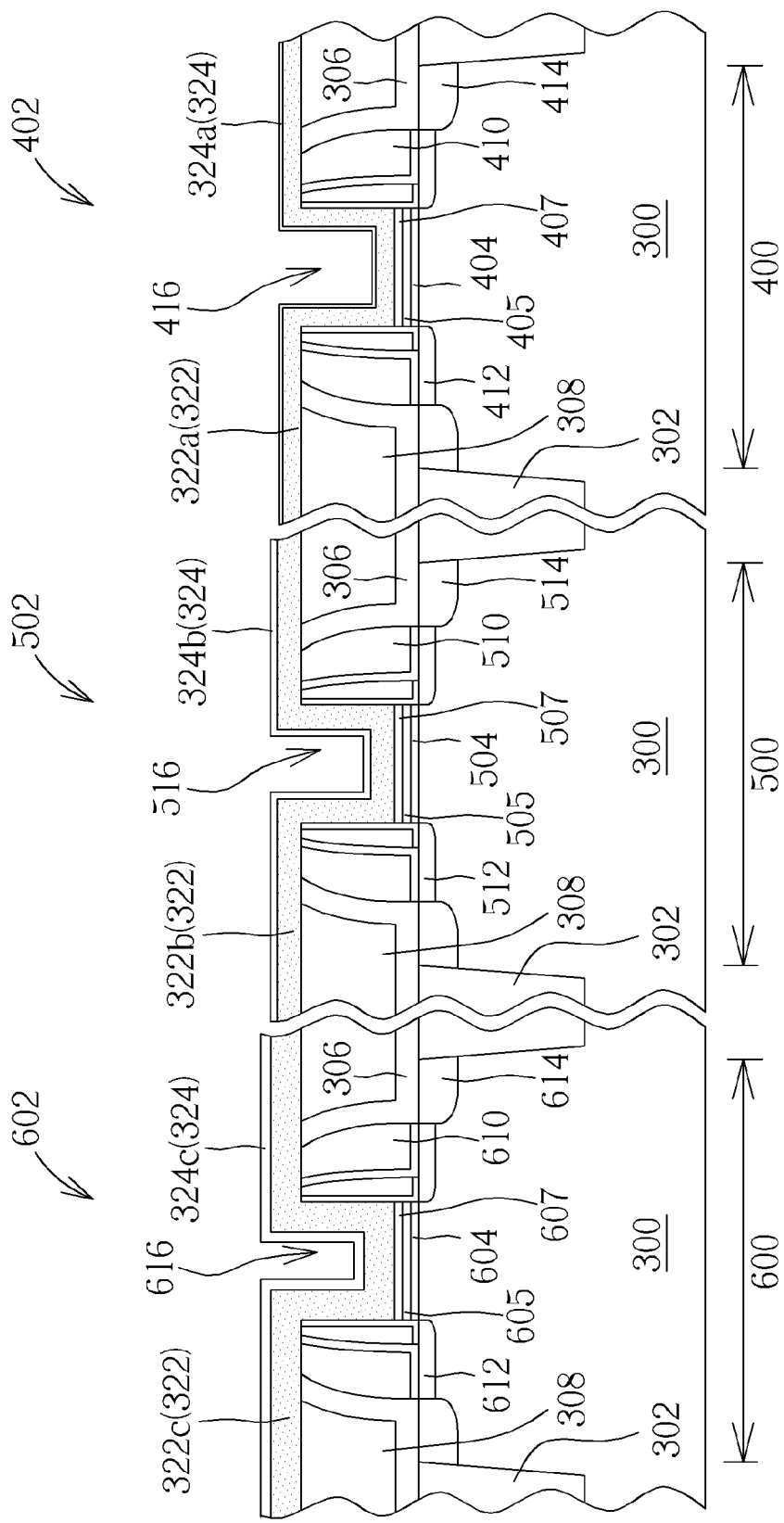

In another embodiment, the upper bottom barrier layer 324 can have different thicknesses. As shown in FIG. 8, the upper bottom barrier layer 324 has a first upper bottom barrier layer 324a in the first trench 416, which is thinnest, a second upper bottom barrier layer 324b in the second trench 516, which is middle, and a third upper bottom barrier layer 324c, which is thickest. In the method of forming the upper bottom layer 324 with different thickness, when the upper bottom barrier layer 324 includes TaN, the forming method thereof is similar to that for forming adjust layer 320; when the upper bottom barrier layer 324 comprises Ta/TaN, the forming method thereof is similar to the method for forming the bottom barrier layer 322. In one embodiment, a nitrogen concentration in the first upper bottom barrier layer 324a>a nitrogen concentration in the second upper bottom barrier layer 324b>a nitrogen concentration in the third upper bottom barrier layer 324c. Alternatively, a tantalum concentration in the first upper bottom barrier layer 324a<a tantalum concentration in the second upper bottom barrier layer 324b>a tantalum concentration in the third upper bottom barrier layer 324c.

Figure 9:
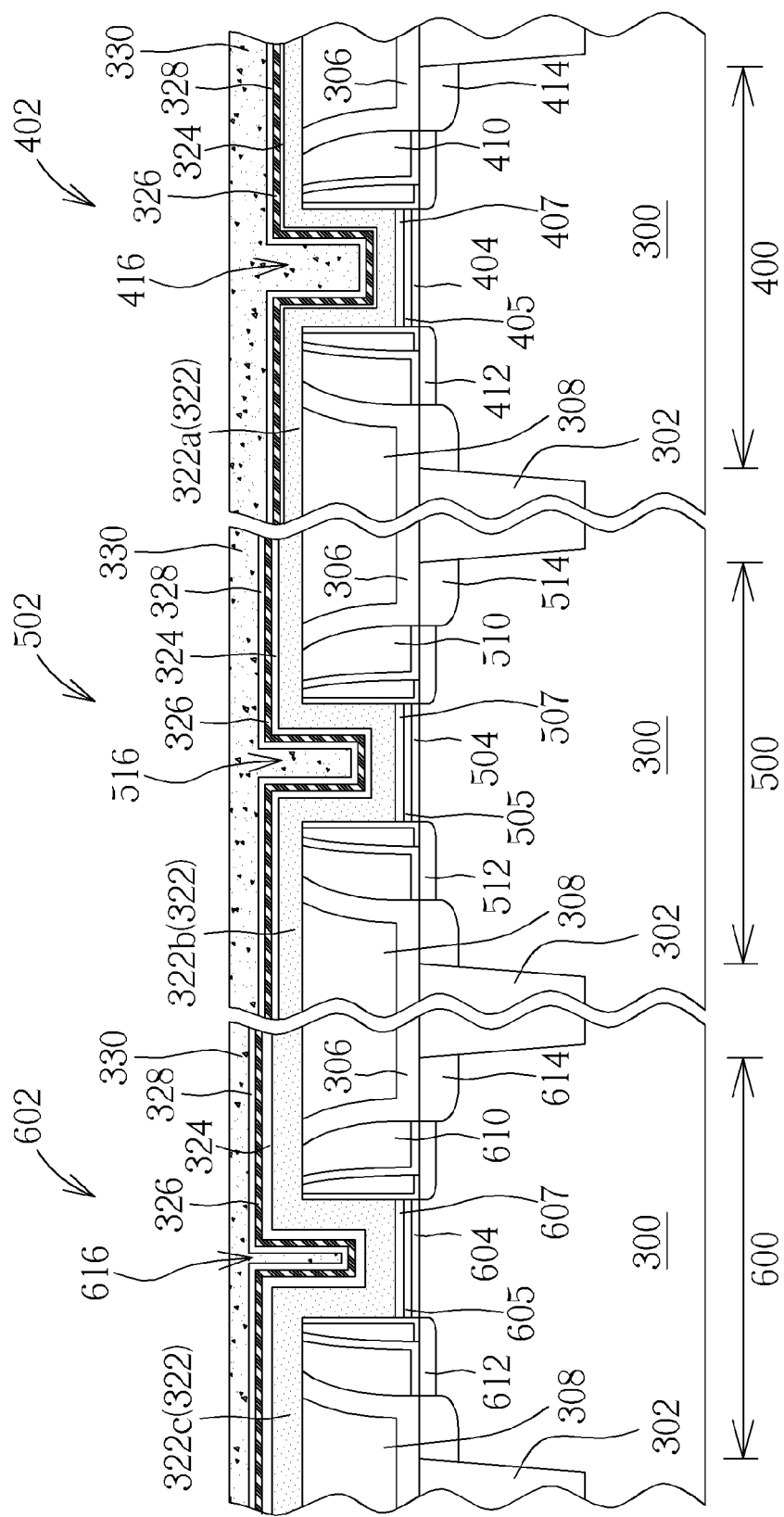

As shown in FIG. 9, a work function metal (WFM) layer 326, a top barrier layer 328 and a metal layer 330 are sequentially formed on the substrate 300 to completely fill the first trench 416, the second trench 516 and the third trench 616. In one embodiment, when the first transistor 402, the second transistor 502 and the third transistor 602 are N type transistors, the WFM layer 326 can include titanium aluminides (TiAl), aluminum zirconium (ZrAl), aluminum tungsten (WAl), aluminum tantalum (TaAl) or aluminum hafnium (HfAl), but should not be limited thereto. When the first transistor 402, the second transistor 502 and the third transistor 602 are P type transistors, the WFM layer 326 can include Ni, Pd, Pt, Be, Ir, Te, Re, Ru, Rh, W, Mo, or WN, RuN, MoN, TiN, TaN, or WC, TaC, TiC, or TiAlN, TaAlN, but should not be limited thereto. The top barrier layer 328 can include TiN, TiAlC, TiAlN, TaN, TaAlC, TaAlN, TiCuC, TiCuN, TaCuC or TaCuN, but is not limited thereto. In one embodiment, the top barrier layer 328 can be omitted. The metal layer 330 includes Al, Ti, Ta, W, Nb, Mo, TiN, TiC, TaN, Ti/W or Ti/TiN, but is not limited thereto.

Figure 10:
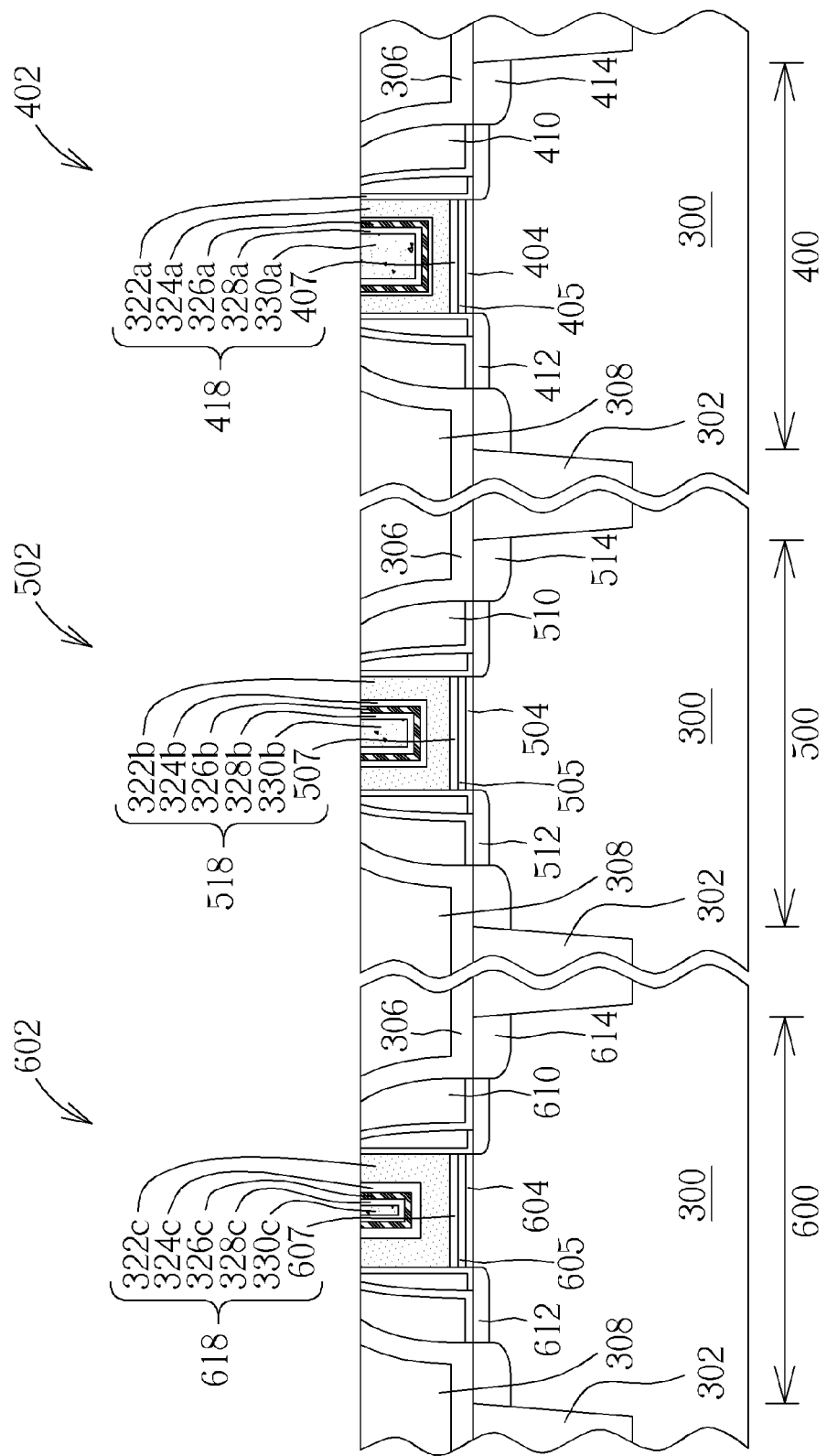

As shown in FIG. 10, a planarization process is performed to simultaneously remove the metal layer 330, the top barrier layer 328, the WFM layer 326, the upper bottom barrier layer 324 and the bottom barrier layer 322 outside of the first trench 416, the second trench 516 and the third trench 616. Thus, the first etch stop layer 407, the first bottom barrier layer 322a, the upper bottom barrier layer (or the first bottom barrier layer 324a), the WFM layer 326 (the first WFM layer 326a herein), the top barrier layer 328 (the first top barrier layer 328a herein) and the metal layer 330 (the first metal layer 330a herein) together form a first metal gate 418 of the first transistor 402. The second etch stop layer 507, the second bottom barrier layer 322b, the upper bottom barrier layer 324 (or the second bottom barrier layer 324b), the WFM layer 326 (the second WFM layer 326b herein), the top barrier layer 328 (the second top barrier layer 328b herein) and the metal layer 330 (the second metal layer 330b herein) together form a second metal gate 518 of the second transistor 502. The third etch stop layer 607, the third bottom barrier layer 322c, the upper bottom barrier layer 324 (or the third bottom barrier layer 324c), the WFM layer 326 (the third WFM layer 326c herein), the top barrier layer 328 (the third top barrier layer 328c herein) and the metal layer 330 (the third metal layer 330c herein) together form a third metal gate 618 in the third transistor 602.

Since the first transistor 402, the second transistor 502 and the third transistor 602 have the bottom barrier layer 322 with different thickness and different compositions, they can exhibit different electrical performance. In detail, the first transistor 402 has the largest threshold voltage, the second transistor 502 has the middle one and the third transistor 602 has the smallest one. In one embodiment, the threshold voltage of the first transistor 402 is about 0.3V to 0.6V; the threshold voltage of the second transistor 502 is about 0.2V to 0.3V; the threshold voltage of the third transistor 602 is about 0.1V to 0.2V.

It should be noted that the above method shown in a gate-last process can also be applied in a gate-first process. Besides, the above method shows forming the high-k gate dielectric layer before removing the sacrificial gate (namely, the high-k first process). However, those skilled in the art can realize that, in the present invention, it is also possible to form the high-k layer after removing the sacrificial gate (namely, the high-k last process). In addition, when the invention is performed in the high-k last process, the material of the dielectric layer formed under the sacrificial gate is not limited to high-k material but can also include another dielectric material such as $SiO_2$. In another embodiment, the first transistor 402, the second transistor 502 and the third transistor 602 can be non-planar transistors such as Fin-FET and is not limited to the planar transistor shown above.

In summary, the present invention provides a structure having plural transistors and the forming method. It is featured that the formed transistors have bottom barrier layers with different thickness and/or composition, thereby tuning the electrical performance of the transistors and providing them with different threshold voltages.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming an integrated circuit which has plural transistors with different threshold voltages, comprising:

providing a dielectric layer having a first trench, a second trench and a third trench;

forming an adjust layer on the dielectric layer, wherein the adjust layer has metal and comprises a first adjust layer in the first trench, a second adjust layer in the second trench and a third adjust layer in the third trench, wherein a thickness of the first adjust layer<a thickness of the second adjust layer<a thickness of the third adjust layer;

forming an assisting layer in the first trench, the second trench and the third trench, wherein the assisting layer has nitrogen;

performing an annealing process, to form a bottom barrier layer on the dielectric layer from the assisting layer and the adjusting layer, wherein the bottom barrier layer comprises a first bottom barrier layer in the first trench, a second bottom barrier layer in the second trench and a third bottom barrier layer of the third trench, wherein a nitrogen concentration of the first bottom barrier layer>a nitrogen concentration of the second bottom barrier layer>a nitrogen concentration of the third bottom barrier layer;

forming a work function metal (WFM) layer on the bottom barrier layer in the first trench, the second trench and the third trench; and forming a metal layer on the WFM layer, wherein the first trench, the second trench and the third trench are completely filled with the metal layer.

2. The method of forming an integrated circuit according to claim 1, wherein the adjust layer is formed before forming the assisting layer.

3. The method of forming an integrated circuit according to claim 1, wherein the assisting layer is formed before forming the adjust layer.

4. The method of forming an integrated circuit according to claim 1, wherein the assisting layer in the first trench, the second trench and the third trench has the same thickness.

5. The method of forming an integrated circuit according to claim 1, wherein the assisting layer in the first trench, the second trench and the third trench has different thicknesses.

6. The method of forming an integrated circuit according to claim 1, wherein after forming the bottom barrier layer and before forming the WFM layer, further comprising:

forming another adjust layer on the dielectric layer, wherein the another adjust layer comprises a first another adjust layer in the first trench, a second another adjust layer in the second trench and a third another adjust layer in the third trench, wherein a thickness of the first another adjust layer<a thickness of the second another adjust layer<a thickness of the third another adjust layer;

forming another assisting layer in the first trench, the second trench and the third trench; and forming an upper bottom barrier layer on the bottom barrier layer from the another adjust layer and the another assisting layer, wherein the upper bottom barrier layer comprises a first upper bottom barrier layer in the first trench, a second upper bottom barrier layer in the second trench and a third upper barrier layer in the third trench.

7. The method of forming an integrated circuit according to claim 6, wherein a nitrogen concentration of the first upper bottom barrier layer>a nitrogen concentration of the second upper bottom barrier layer>a nitrogen concentration of the third upper bottom barrier layer.

8. The method of forming an integrated circuit according to claim 6, wherein a tantalum concentration of the first upper bottom barrier layer<a tantalum concentration of the second upper bottom barrier layer>a tantalum concentration of the third upper bottom barrier layer.

9. The method of forming an integrated circuit according to claim 1, wherein the WFM layer comprises N type WFM layer.

* * * * *